United States Patent [19]
Galand et al.

[11] Patent Number: 5,689,518
[45] Date of Patent: Nov. 18, 1997

[54] METHOD AND AN APPARATUS TO MODIFY CRC IN INTERMEDIATE HIGH SPEED NETWORK NODES

[75] Inventors: Claude Galand, Cagnes-Sur-Mer; Eric Saint-Georges, La Gaude; Victor Spagnol, Cagnes-Sur-Mer, all of France

[73] Assignee: International Business Machines Corporation, Armonk, N.Y.

[21] Appl. No.: 431,918

[22] Filed: Apr. 28, 1995

[30] Foreign Application Priority Data

May 6, 1994 [EP] European Pat. Off. ............. 94480036

[51] Int. Cl.$^6$ .................................................. H03M 13/00
[52] U.S. Cl. .............................................. 371/37.1; 371/53
[58] Field of Search .............................. 371/37.1, 53, 42, 371/37.7, 37.8

[56] References Cited

U.S. PATENT DOCUMENTS

| 5,131,012 | 7/1992 | Dravida | 371/42 |
| 5,428,629 | 6/1995 | Gutman et al. | 371/37.1 |

FOREIGN PATENT DOCUMENTS

| 0313707 | 10/1987 | European Pat. Off. | H04L 1/00 |
| 313707 | 5/1989 | European Pat. Off. | 371/37.1 |
| 0552861 | 1/1992 | European Pat. Off. | H03M 13/00 |
| 3130504 | 1/1981 | Germany | H03K 13/32 |

OTHER PUBLICATIONS

IBM Journal of Research & Dev., Nov. 1989, No. 6, pp. 618–626.

IBM TDB, vol. 34, No. 10A, Mar. 1992, pp. 34–38.

European Search Report EP 94 48 0036, 28/9/94.

*Primary Examiner*—Reba I. Elmore
*Assistant Examiner*—Steven R. Garland
*Attorney, Agent, or Firm*—Gerald R. Woods

[57] ABSTRACT

A method and an apparatus to calculate in an intermediate node of a communication network, the new Frame Check Sequence (FCS) appended to a data bits message which has been modified in said intermediate network node. The invention is useful for high speed networks where the transit delay needs to be optimized in the network along with the computing resources in the intermediate network nodes in terms of computer cycles and memory size. The invention consists in calculating the difference between the FCS using the difference between the modified fields in the message and the distance in bits between the end of the modified field and the end of the message; the calculation consists in differentiating 'short messages' in the data flow and to provide an optimized processing for the short messages, the processing for larger messages being based on this first optimized processing. The calculation of the modified FCS comprises operations on polynomials whose coefficients belong to the Galois's Field and whose degree is limited to the one of the polynomial generator of the corresponding CRC code. The calculations include also look up operations in tables limited in size. The choice between the possible implementations (full software, full hardware and mixed hardware and software with the usage of a Remult operator for the last two) will depend on the kind of the network (Frame Relay or other network) and the capacity of the intermediate network node.

9 Claims, 7 Drawing Sheets

| n | MAX $n_0$ VALUE | MAX $n_1$ VALUE | TABLE SIZE (IN BYTES) | MAX PACKET LENGTH FOR COMPUTING CRC WITH A SINGLE TABLE |
|---|---|---|---|---|
| 2 | 1 | 4095 | 8196 | 1 |
| 4 | 3 | 2047 | 4104 | 3 |
| 8 | 7 | 1023 | 2064 | 7 |
| 16 | 15 | 511 | 1056 | 15 |
| 32 | 31 | 255 | 576 | 31 |
| 64 | 63 | 127 | 384 | 63 |
| 128 | 127 | 637 | 384 | 127 |
| 256 | 255 | 31 | 576 | 255 |
| 512 | 511 | 15 | 1056 | 511 |
| 1024 | 1023 | 7 | 2064 | 1023 |
| 2048 | 2047 | 3 | 4104 | 2047 |
| 4096 | 4095 | 1 | 8196 | 4095 |
| 8192 | 8191 | 0 | 16384 | 8191 |

FIG. 2

METHOD AND AN APPARATUS TO MODIFY CRC IN INTERMEDIATE HIGH SPEED NETWORK NODES

FIELD OF THE INVENTION

This invention relates to a method and an apparatus for modifying Cyclic Redundany Check (CRC) encoded digital messages conveyed on high speed telecommunication networks.

BACKGROUND OF THE INVENTION

Due to evolution of networks towards more complex mixtures of sub-networks with heterogeneous architectures, it is becoming more difficult to meet the requirement to support distributed computing applications across high speed backbones that can carry LAN traffic, voice, video and traffic over hosts channel attached workstations. One challenge for high speed networking is to minimize the computing resources required within the network nodes to route the messages while ensuring security of the data conveyed in the network.

Particularly, it is fundamental to reduce processing requirements at intermediate network nodes allowing messages to travel from source nodes to end nodes along a number of point-to-point links. If intermediate processing time can be minimized, the network time should be lower and the thruput as high as possible.

When digital messages are transmitted over any telecommunication networks, some errors can be expected. To ensure data integrity, the serialized data is protected with error detection codes.

In high speed networks, the lines may have a low error rate and an error detection code is computed only by the original transmitting node and checked at the other end by the final receiving node.

For both reasons of error coverage and implementation ease, linear and systematic codes and particularly Cyclic Redundancy Check (CRC) codes are used in most of synchronous data communications. When properly used, CRC codes will detect much more than 99% of all errors in transmission.

The advantage of the CRC is highlighted with the following mathematical description: the transmitted data is represented as a pure binary number defined by a polynomial expression where the coefficients belongs to modulo 2 Galois's Field.

The 12 bits data '100010010010' is represented as a degree 11 polynomial:

$$P(X) = X^{11} + X^7 + X^4 + X$$

Encoding the data consists in concatenating to the data a set of redundancy check bits. These check bits can be deducted from a simple polynomial calculation applied to the polynomial expressions representing the data.

These check bits are deducted, from the remainder of the polynomial division of one polynomial expression based on the the data to be checked, a predefined polynomial characterizing the code (the generator polynomial).

Decoding the data Consists also in implementing a simple polynomial division of the polynomial representing the transmitted data including the check bits by the generator polynomial and checking that the remainder is the expected one.

Suppose P(X) represents the data to be transmitted and checked, G(X) the generator polynomial, g and p the degree of respectively G(X) and P(X).

If Q(X) and R(X) are the quotient and remainder of the division of XgP(X) by G(X) respectively:

$$X^g P(X) = G(X)Q(X) + R(X)$$

One notes that degree of $X^g P(X)$ is g+p and that its polynomial coefficients for the X powers lower than g are all zero.

The degree of R(X) is <g (as remainder of division by G(X)).

Now, as polynomial coefficients belong to modulo 2 Galois's Field:

$$X^g P(X) + R(X) = G(X)Q(X) \qquad \text{(expression 1)}$$

The left side of this last expression is the polynomial expression of the encoded data, P(X) being the polynomial expression of the initial data to encode.

The encoded data is represented by $$X^g P(X) + R(X)$$

Assuming that the data is a number of p bits and that the code generator polynomial is of degree g, the encoded data will be a number of p+g bits where the first left p bits are the initial data and the g last ones are the calculated redundancy check bits.

Expression 1 means that the remainder of the division of $X^g P(X) + R(X)$ by $G(X)$ is zero. The data is correct at the receiving station the polynomial representing the received data is a multiplier of the generator polynomial.

Increased complexity of the cyclic code gives powerful detection but also greater redundancy with each block of data transmitted. The optimum codes are a compromise between good burst error detection and low redundancy.

As a matter of fact, a CRC code is used to generate the Frame Check Sequence (FCS) which is appended at the end of the original message so it can be checked at far end for proper transmission. The transmitting network node adds the FCS to the original message and the entire received message (original message plus FCS) is checked at the end node.

IEEE 802-series networks employ the ANSI standard 32-bit CRC algorithm where the generating polynomial is:

$$X^{32} + X^{26} + X^{23} + X^{22} + X^{16} + X^{12} + X^{11} + X^{10} + X^8 + X^7 + X^5 + X^4 + X^2 + X + 1$$

One CCITT standard (V41) recommends the following cyclic polynomial as generator polynomial:

$$X^{16} + X^{12} + X^5 + 1$$

This cyclic polynomial is used by the most of synchronous bits oriented line transmission protocols. There are 16 redundancy check bits in the data encoded with the CCITT V41 generator cyclic polynomial.

As explained in "Teleinformatique I", H. Nussbaumer, Presses Polytechniques Romandes, 1987 a FCS is calculated based on the CRC calculation with the CCITT V41 generator cyclic polynomial. It is a 16 bits long field defined in the following lines.

Assuming that L(X) is the polynomial of degree 15 where all the coefficients are equal to 1, the FCS of a message represented by the polynomial P(X) of degree p is defined as is:

$$L(X) = X^{15} + X^{14} + \ldots + X^2 + X + 1$$

$$X^{16} P(X) + X^p L(X) = Q(X)G(X) + R(X)$$

$$FCS(P(X)) = L(X) + R(X)$$

R(X) being the remainder (Rem):

$$FCS(P(X))=Rem_{G(X)}(X^{16}P(X)+X^pL(X))$$

The polynomial representing the encoded message is:

$$S(X)=X^{16}P(X)+FCS(P(X))$$

At the receiving node, the FCS is computed on the encoded message: there is no error in transmission if the computation yields the constant message represented by the following polynomial:

$$X^{15}+X^{14}+X^{13}+X^{12}+X^7+X^5+X^4+X^3$$

Data is transported in packets, cells or variable length frames which are normally shorter blocks than the original data; the message includes a header preceding the original data for routing in the intermediate network nodes and packet resequencing at the end node. The FCS is calculated on the original data plus the header.

Some routing methods result in the message (more particularly the header) being modified in the intermediate network nodes. If the modified message is sent along with the original FCS, the message will be rejected by the receiving node because the calculated and received FCS will not match. It is not recommended the FCS be checked and recomputed in the intermediate nodes since that requires computing resources and overall does not protect from errors which occur in a node after the FCS is checked and before it is recomputed. As D. R. Irvin explains (in IBM JOURNAL RESEARCH AND DEVELOPMENT VOL 33 NO. 6 November 1989), the computation of CRC being a linear operation, a new FCS can be calculated by modifying the previous one. This raises the need of calculating in the intermediate network nodes a modification to the original FCS based on the message changes instead of recalculating a new FCS from the full message.

To calculate in the intermediate network nodes the new FCS corresponding to a change in the message, it is sufficient to calculate the difference (dFCS) between the new and the previous FCS; the polynomial representation of new FCS will be deducted by simple modulo 2 addition in Galois's Field of the previous FCS polynomial and the difference (dFCS). This is easily implemented with a XOR logical function.

Assuming that P(X) represents the message originally sent in the network and P'(X) the message modified in the intermediate network node:

$$dFCS=FCS(P'(X))-FCS(P(X))$$

$$dFCS=Rem_{G(X)}(X^{16}P'(X)+X^pL(X))-Rem_{G(X)}(X^{16}P(X)+X^pL(X))$$

$$dFCS=Rem_{G(X)}(X^{16}(P'(X)-P(X))) \quad \text{(expression 2)}$$

According to FIG. 1, if m is the distance in bits between the last bit of the modified field and the end of the message; assuming H(X) and H'(X) are the polynomials representing the previous and modified fields in P(X) and P'(X) and B(X) defined as follows:

$$B(X)=(H'(X)-H(X))/X^m$$

then, expression 2 can be written as follows:

$$dFCS=Rem_{G(X)}(X^{m+16}B(X)) \quad \text{(expression 3)}$$

Assuming that any type of data conveyed in the networks are byte based, m is assumed as a multiple of 8 since the modified field will end at a byte boundary in the message in bits. Thus we can define an integer n such as:

$$8n=m+16 \text{ and } n=m/8+2$$

$$dFCS=Rem_{G(X)}(X^{8n}B(X)) \quad \text{(expression 4)}$$

B(X) can be easily implemented by a logical XOR on the old field modified H(X) and the new field H'(X), the computation of dFCS is reduced to the computation of expression 3 or expression 4.

Existing methods to achieve this dFCS calculation are disclosed in the D. R. Irvin article and the EP-313707 patent on the same subject. These methods include usage of tables because of the properties of CRC code: linearity and cyclicity. The amount of memory required for the necessary tables and the number of computer cycles required for dFCS computation are not negligible.

In order to have a reference in terms of computing resources necessary with the best existing solution, let's evaluate these numbers if we implement the EP-313707 solution.

The solution proposed by EP-313707 patent assumes that the field of the messages to be altered is not longer than 2 bytes, and m is a multiple of 8. Thus, the mathematical description of this solution starts from expression 4. The basic idea is to split n into a binary number (of degree 16 for frames up to 64K bytes long):

$$dFCS=Rem_{G(X)}(X^{8n}B(X)) \quad \text{(expression 4)}$$

The EP-313707 patent solution proposes a bit-wise decomposition:

$$n=n_{15}2^{15}+n_{14}2^{14}+\ldots n_38+n_24+n_12+n_0$$

Then expression 4 can be rewritten as:

$$dFCS=Rem_{G(X)}(F(n_{15}) \cdot Rem_{G(X)}(F(n_{14}) \cdot Rem_{G(X)}(F(n_1) \cdot Rem_{G(X)}(F(n_0) \cdot B(X)) \ldots )))$$

with $F(n_i)=1$ if $n_i=0$ and $F(n_i)=Rem_{G(X)}(X^{8 \cdot 2^i})$ if $n_i=1$ $F(n_i)$ can be computed by look up to an input-table T defined as:

$$T(i)=Rem_{G(X)}(X^{8 \cdot 2^i})$$

This table to be read for any n not equal to zero.

The corresponding algorithm can be summarized as follows:

R←B(X)
do i=0 to 15
if $n_i$=1
then R←$Rem_{G(X)}$(R·T(i))
end

If, as in the case of Frame Relay, the maximum frame length is 8K bytes, then i takes all the integer values from 0 to 12 and therefore, the maximum number of iterations is 13 and the T table size is 26 bytes. This implies a minimum of 900 processor cycles for computation.

Therefore, the dFCS computation in the intermediate network nodes will be optimized if one succeeds in implementing in these nodes the calculation represented by the mathematical expressions 3 or 4, reducing the memory size for tables and the number of computer cycles versus any existing solution.

SUMMARY OF THE INVENTION

The object of the invention is to provide a method and an apparatus for optimizing computing resources in term of memory size and number of processor cycles when calculating the modified CRC encoded messages in intermediate network nodes of a communication network.

It is another objective to provide such a method which is as simple as possible in order to be easily implemented.

The invention consists in calculating the difference between the FCS using the difference between the modified fields in the message and the distance in bits between the end of the modified field and the end of the message.

The principle of the subject invention is first to distinguish the computation upon the size of the message and to optimize the processing for treatment of short messages which is the most costly in terms of number of processing cycles. Therefore, two algorithms are defined, one for 'short messages' and one for 'long messages', these two algorithms being correlated. The mathematical description of the solution starts from the expressions 3 or 4.

The second basis of the solution is the definition of a new function (Remult) for hardware implementations and limited size tables for software implementations which are used in the algorithms for short and long messages.

In order to simplify the hardware implementation, all the polynomial multiplications included in the algorithms for CRC modifications are reduced to multiplications on polynomial of degrees not greater than the degree of the generator polynomial.

The invention includes the following steps:
Defining a message size differentiation between 'short' and 'long' messages;
defining a Remult function as part of dFCS calculation for short or long messages treatment as well;
defining tables for short messages dFCS calculation;
defining tables for long messages dFCS calculation;
defining an algorithm for short messages dFCS calculation.
defining an algorithm for long messages dFCS calculation.

The different embodiments of the invention depend on two criteria which are the network type (implying a message size, message structure, CRC code) and the choice between a hardware or software implementation.

A first solution consists in having a full software solution which reaches the performance objectives of the invention. The preferred embodiment described with details hereunder has a mixed hardware and software implementation: only the Remult function is implemented in hardware as a special instruction of a processor inside the intermediate network node adapter. The performance in terms of number of computer cycles and table sizes will be compared in the 'preferred embodiment' section of the description to the best prior art solution. The full hardware implementation includes the same Remult hardware function as part of a coprocessor implementation.

BRIEF DESCRIPTION OF THE DRAWINGS

FIG. 2 is a table providing the tables sizes corresponding to different packet lengths;

DETAILED DESCRIPTION OF A PREFERRED EMBODIMENT OF THE INVENTION

The preferred embodiment of the invention described hereunder applies to a Frame Relay network in which the messages sent in the network exist in variable length frames with a maximum size of 8K bytes including a 2 bytes frame header. In this case the field modified in the frame is the 2 bytes header.

Figure 1:
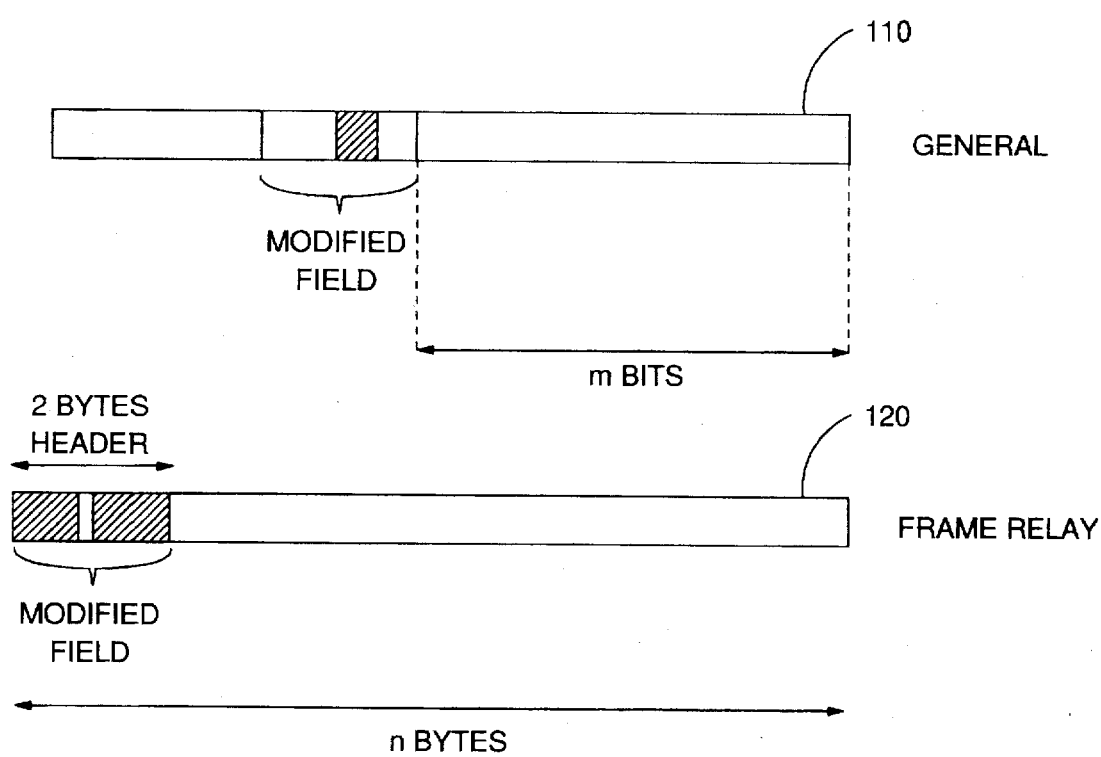
FIG. 1 describes the field of the messages before and after modification in an intermediate network node.

In FIG. 1, the message structure 110 is a general message format and the message structure 120 applies to the special case of Frame Relay. The parameter m is the distance in bits between the end of the modifiable message field and the end of the message. Considering that messages are byte based, and m is typically a multiple of 8, the integer n defined as n=(m+16)/8 is, in the case of Frame Relay the length of the frame in bytes. This implies that this value is easily obtained. Let's start from expression 4:

$$dFCS=Rem_{G(X)}(X^{8n} B(X))$$ (expression 4)

The basic idea is to split n into a kind of base N with N being a power of 2

$$n=n_0+N \cdot n_1$$

with $0 \leq n_0 \leq N-1$. As 8n is lower or equal to 8K bytes (the maximum length of a Frame Relay frame), n is lower or equal to 8K (=8192) and $$0 \leq n_1 \leq 8192/N$$

According to CRC code linearity, expression 4 can be rewritten as:

$$dFCS=Rem_{G(X)}(X^{8N \cdot n_1}) \cdot X^{8n_0} \cdot B(X))$$

$$dFCS=Rem_{G(X)}(Rem_{G(X)}(X^{8N \cdot n_1}) \cdot Rem_{G(X)}(X^{8n_0} \cdot B(X)))$$ (expression 5)

$$dFCS=Rem_{G(X)}(Rem_{G(X)}(X^{8N \cdot n_1}) \cdot Rem_{G(X)}(Rem_{G(X)}(X^{8n_0}) \cdot Rem_{G(X)}(B(X))))$$

The expression $Rem_{G(X)}(X^{8N \cdot n_1})$ can be precomputed in a table, $T_1$, of 8192/N inputs, as a function of $n_1$:

$$T_1(n_1)=Rem_{G(X)}(X^{8N \cdot n_1})$$

The expression $Rem_{G(X)}(X^{8n_0})$ can be precomputed in a table, $T_0$, of N inputs, as a function of $n_0$:

$$T_0(n_0)=Rem_{G(X)}(X^{8n_0})$$

$$dFCS=Rem_{G(X)}(T_1(n_1) \cdot Rem_{G(X)}(T_0(n_0) \cdot Rem_{G(X)}(B(X))))$$

B(X) being of degree<16 (two bytes modified field in the Frame Relay messages), $$dFCS=Rem_{G(X)}(T_1(n_1) \cdot Rem_{G(X)}(T_0(n_0) \cdot B(X)))$$ (expression 6)

Let's define a new function Remult applied to 2 polynomials A(X) and B(X) such as:

$$A(X) Remult\ B(X)=Rem_{G(X)}(A(X) \cdot B(X))$$

using Remult function, expression 6 becomes:

$$dFCS = T_1(n_1) \text{ Remult } (T_0(n_0) \text{ Remult } B(X))$$

The algorithm to be run is the following (algorithm 1):
Read the $T_0$ table at the address $n_0$
perform B(X) Remult $T_0$ ($n_0$) (and let's call R(X) the result)
read the $T_1$ table at the address $n_1$
perform R(X) Remult $T_1(n_1)$ If n<N then $n_1=0$ and $n=n_0$. Only $T_0$ table needs to be read and the algorithm is limited to 2 operations:

Read the $T_0$ table at the address $n_0$
perform R(X) Remult $T(n_1)$

This last simpler algorithm is for 'short packets' with length lower than N.

To evaluate the table size, we first now that the polynomial representation of one entry is a remainder of a division by G(X) of degree 16. Thus, a table entry is on 2 bytes.

$$n = n_0 + N \cdot n_1$$

$$n \leq 8192 \text{ and } 0 \leq n_1 \leq 8192/N$$

The number of entries is N for $T_0(n_0)$ table and 8192/N for $T_1(n_1)$ table. The total tables size for dFCS calculation is:
Size (in bytes)=2(N+8192/N)

One can refer to the table of FIG. 2 providing the different $T_0$ and $T_1$ table sizes necessary to perform dFCS calculation corresponding to the different message size and the chosen size for 'short messages'. For example, for short packet of 256 bytes, the table size is 576 bytes.

Figure 3:
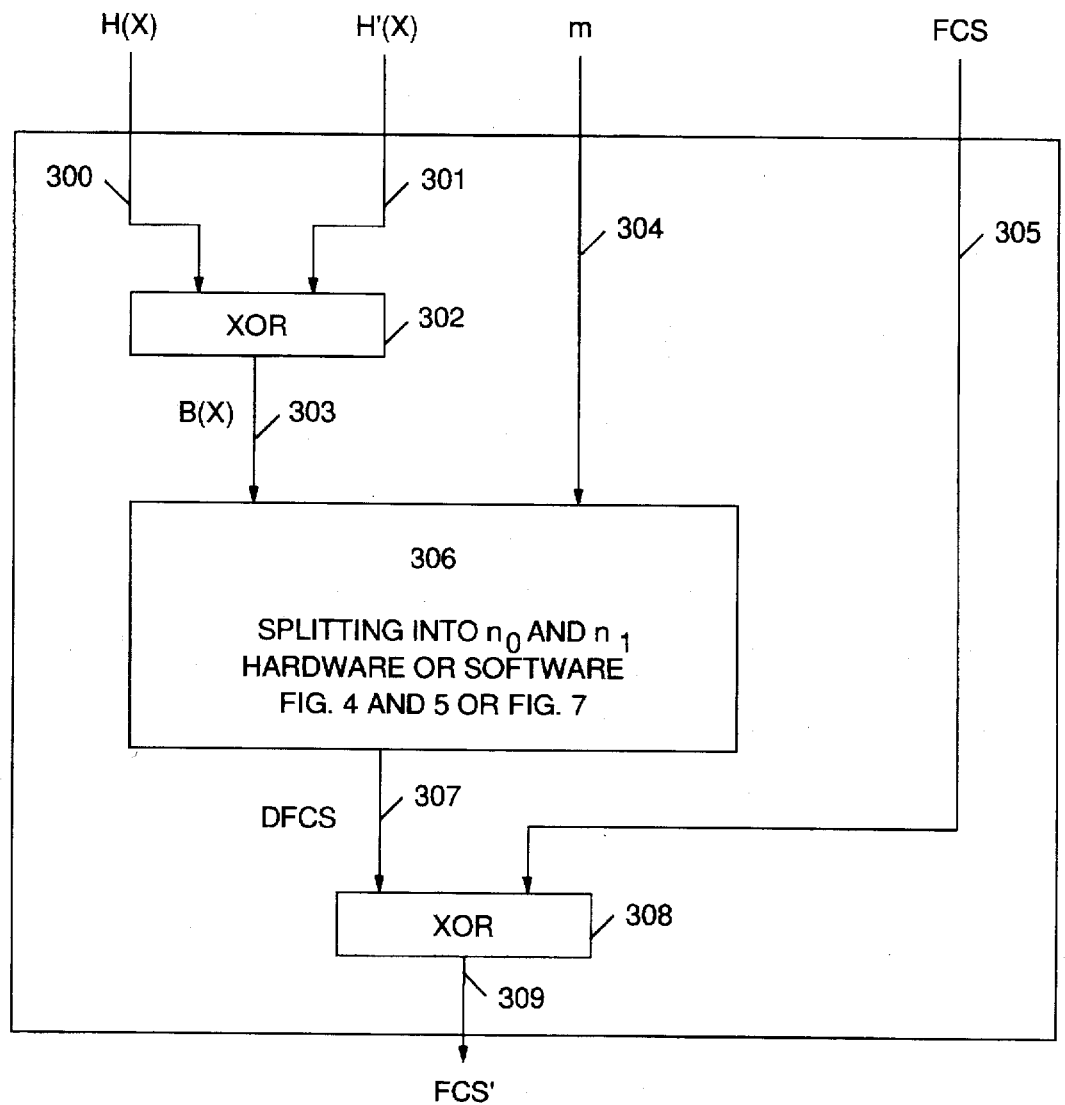
FIG. 3 is a block diagram representing the global logical interfaces of the general solution.

The block diagram of FIG. 3 describes the solution as implemented in an intermediate network node (in the line adapter part of the network node) for the calculation of the new FCS of a modified message.

A sixteen 300 16 bits bus 300 conveys the original value of the message field which will be modified in the intermediate network node. Mathematically this original message field is represented by the polynomial H(X) (see description above). Another sixteen bits bus 301 conveys the message field modified mathematically represented by the polynomial H'(X). The block 302 represents the logical XOR function and the result of this logical operation is conveyed on the sixteen bits bus 303 and is represented by the polynomial B(X). The value m=8n−16 is conveyed on the sixteen bits bus 304. B(X) and m are the inputs to the 306 block for calculation of dFCS. On sixteen bits bus 305 is conveyed the original FCS. dFCS and the original FCS are the inputs of the logical XOR operator represented by the block 308. The output on the sixteen 16 bits bus 309 is new value of FCS'.

The block 306 in FIG. 3 is for dFCS computation. The preferred embodiment of the invention is a software implementation of the solution of the general algorithm. Moreover, let's suppose the Remult function is implemented in hardware as a special instruction of the processor inside the intermediate network node adapter. The algorithm includes 5 instructions:
R1←B(X)
R2←$T_0(n_0)$ Read the $T_0$ table
R1←R1 Remult R2
R2←$T_1(n_1)$ Read the $T_1$ table
R1←R1 Remult R2

If the message is a 'short packet' (means n<N and $n_1=0$) the algorithm is reduced to the 3 instructions:
R1←B(X)
R2←$T_0(n)$ Read the $T_0$ table
R1←R1 Remult R2

As we have taken in the assumption a maximum byte count of 8K, the number of bits in the message is 13. If N=256, $n_0$ is made of the 8 low order bits of the frame bytes count and $n_1$ is the 5 high order bits. In that case (refer to the table, FIG. 2) the table size requires 576 bytes.

As for computer cycles, one can see that large packets computation takes 5 cycles and short packets computation requires 3 cycles.

Figure 4:
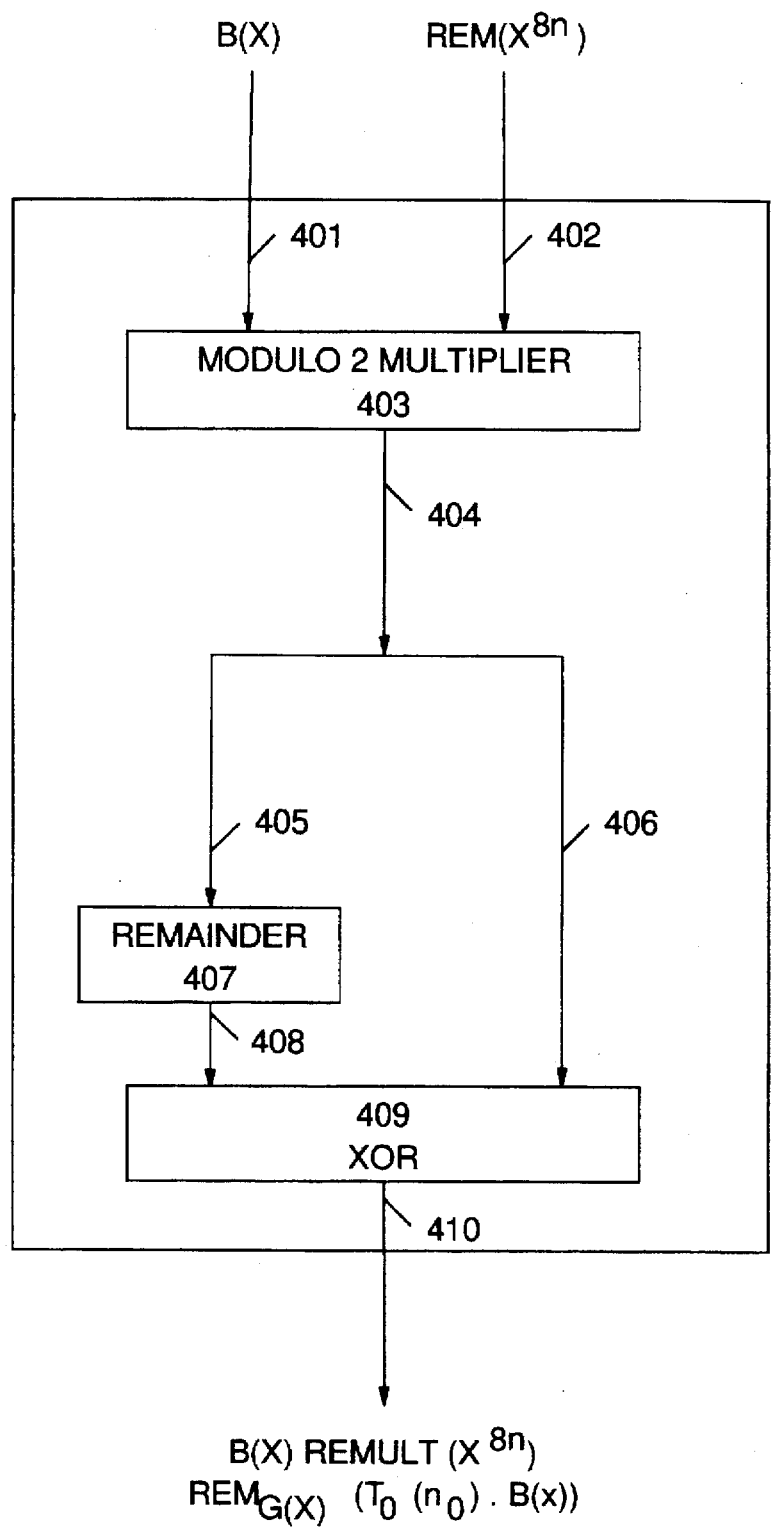
FIG. 4 is a block diagram representing one hardware implementation of Remult function

FIG. 4 describes the hardware implementation of the Remult function.

Polynomial expression of the Remult function applied to the polynomials A(X) and B(X) is:

$$A(X) \text{Remult } B(X) = \text{Rem}_{G(X)}(A(X) \cdot B(X))$$

As the assumptions for this special embodiment description is that the modification of the message applies to two bytes only of the message header, the polynomials which will be considered in this Remult implementation are of degree 15.

It comprises the following three entities:

1. A 16 bits×16 bits modulo 2 multiplier (403) operating as a classical multiplier but without carry, the polynomial coefficients belonging to Galois's Field modulo 2; the result on 31 bits is conveyed on the thirty two bits bus 404. The 2×16 bits inputs are conveyed on input sixteen bits buses 401 and 402.

The module 2 multiplier can be implemented with 256×2 way NAND and 235×2 way XOR. It is 5 layers deep.

2. A function (407) which computes the remainder of the division by G(X) of the 15 high order bits of the result obtained by the modulo 2 multiplication of this result (on sixteen bits bus 405), by $X_{16}$. It can be implemented with 48×2 way XOR and is 8 layers deep.

3. The addition of the previous result (on sixteen bits bus 408) to the 16 low order bits of the modulo 2 multiplication (on sixteen bits bus 406). This requires 16×2 way XOR (409) and is 1 layer deep. The result of the operation 409 is conveyed on bus 410.

The Remult function can be built in hardware with 555×2 way gates, which is in the order of 1% of a 100K gate chip like those available in today's technology. The total depth is 14 layers, which represents less than 20 Ns delay in a 0.8 CMOS technology The choice of the limit size between short and large packets depends on the capacity of the intermediate network node in terms of computing resources and memory size.

Figure 6:
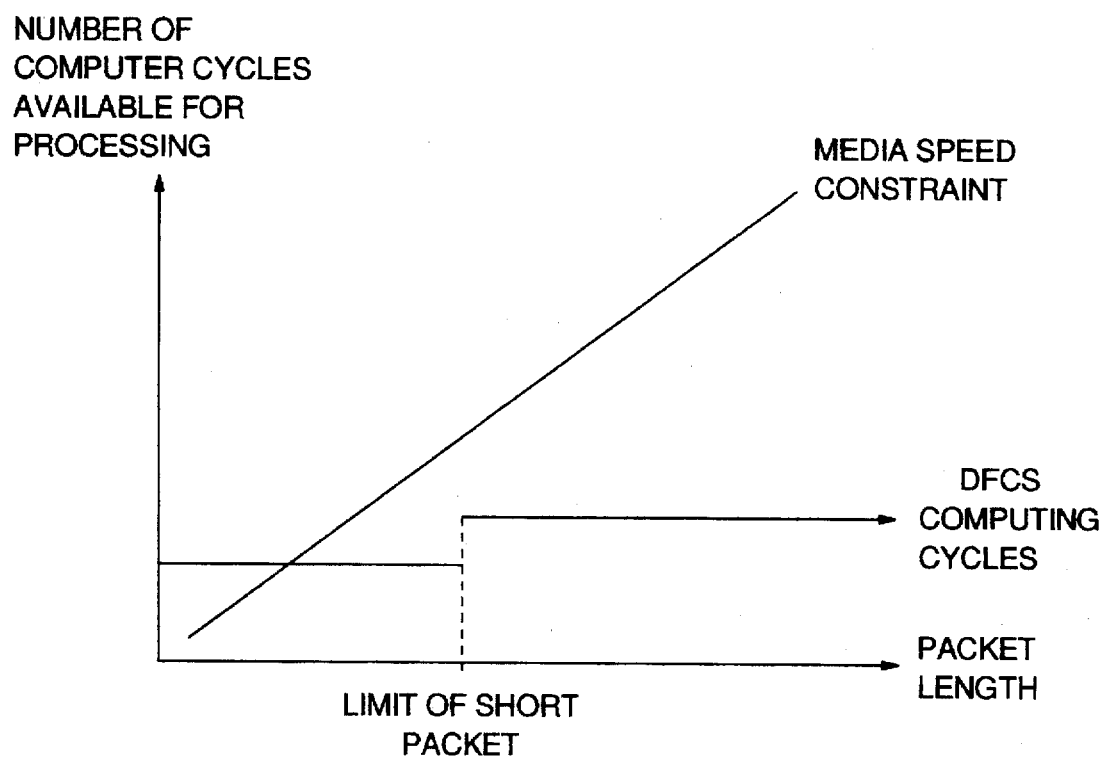
FIG. 6 is a graph of number of computer cycles being a function of the message length with two curves, one (610) representing the maximum computing capacity of the intermediate network node and the other one (620) representing the computing resources for modified FCS computation.

The choice of the 'N' base corresponds to the maximum size of 'short messages'. It is the best compromise among all the performance characteristics of the network node. In terms of cycles for computing, as previously said, processing for short messages is relatively more expensive compared to the treatment of large messages; whatever the size of the messages, the computing cycles necessary for dFCS computation must not exceed the processor capacity, which depends on the media speed constraint. The maximum size of short messages must be chosen taking into account the computing capacity. FIG. 6 illustrates the computing capacity of one intermediate network node, considering the media speed and the size of the messages. The curve (in two steps) representing the cycles necessary for dFCS calculation must not exceed the second half region defined by the media speed constraint curve. The invention optimizes the processing for short messages and the algorithm for large packets extends the optimized algorithm for short packets.

As the different embodiments of the invention depend on two criteria which are the network type and the choice between a hardware or software implementation, let's see now that the solution reaches also the performance and simplicity objectives in the other cases than those presented with the special embodiment solution.

If the network is not a Frame Relay network, let's consider the alternatives and the effect of the invention applied to the other network message structure:

The modified field is not the header: this implies that the number n is not directly the size of the message in bytes but must be deducted from the size of the message. This require one step more but not really significant in the global performance of the dFCS calculation.

If the message is not based on bytes, but on bits it is not the case with the current network messages requiring CRC security checking but the invention applies also to this kind of structure: the only impact is on tables size which is only multiplied by 8:

$$dFCS = Rem_{G(X)}(X^{m+16}B(X))\quad\text{(expression 3)}$$

If m is no more a multiple of 8 we apply the split in base N to an other defined n:

$$n = m + 16$$

m is a value in bits, $n \leq 8.8192$ $$n = n_0 + N \cdot n_1$$

$n \leq 8.8192$ and $0 \leq n_1 \leq 8.8192/N$

The number of entries is N (max 8.8192) for $T_0(n_0)$ table and $8.8192/N$ for $T_1(n_1)$ table. The table size has only been multiplied by 8.

The max length of the message can be greater than 8K Bytes (case of Frame Relay), it does not reduce the performance improvements of the invention:

Assuming max length of the message is 8K and N is 256 bytes, the table size is:

$$2(N + 8K/N) = 576 \text{ bytes}$$

Assuming max message length is 64K and N is 256 bytes, the table size is only:

$$2(N + 8K/N) = 1024 \text{ bytes}$$

In the case of Frame Relay, the calculation of dFCS is based on multiplications of polynomials of degree lower or equal to 16 which is the degree of the generator polynomial: this simplifies the physical implementation of CRC calculations in the intermediate network nodes. If the degree of the polynomial representing the modified field size is larger or equal to the degree of the generator polynomial (CRC polynomial generator can be of degree 16, 32 etc....), the field will be split into several fields of degree lower or equal to the degree of the polynomial generator and the same general algorithm would be applied as many times as needed with the similar performance benefits.

The maximum length of the message can be greater than 8K Bytes (case of Frame Relay), it does not impact the performance improvements of the invention:

As for the other embodiments of the invention, we can consider other cases such as full hardware implementation and full software implementation.

Full hardware implementation.

Figure 5:
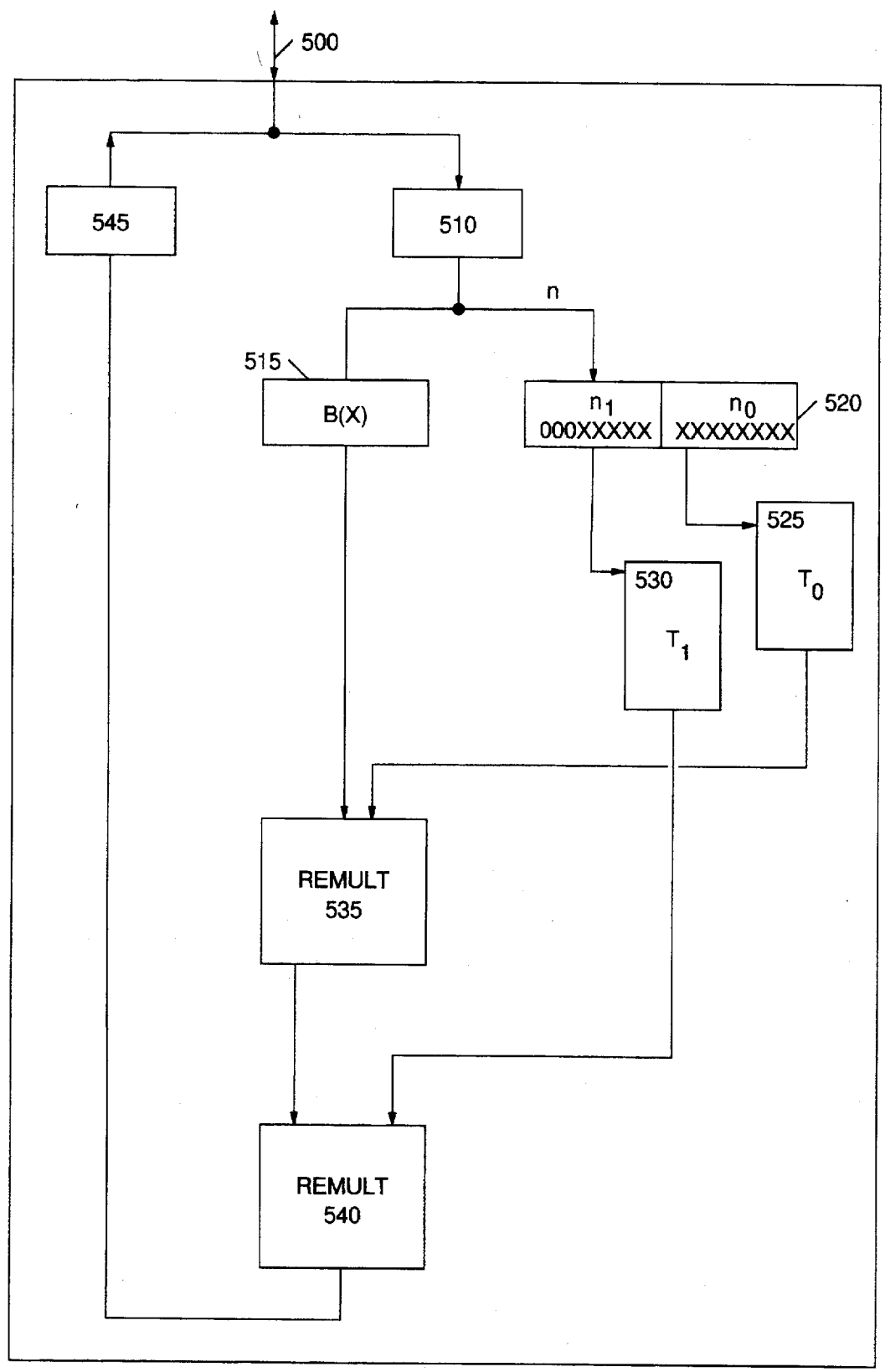
FIG. 5 is a block diagram representing the hardware implementation of the solution

FIG. 5 illustrates a coprocessor implementation of block 306 (FIG. 3) in the solution for Frame Relay. The functions of this coprocessor which will be used by the master processor are the following:

Write B(X) and n: B(X) is provided by the XOR of old and previous field modified (see FIG. 3). n is the frame byte count (maximum 8K in the case of Frame Relay, represented with 13 bits).

Read the result: dFCS. The result is available after one or two coprocessor cycles depending on the size of the message.

All the buses in FIG. 5 are sixteen bits buses. The block 510 is for reception of the input data: B(X) and n, the number of bytes. B(X) is sent and stored at the level of block 515 to be sent as input to the block Remult operator 535; n is sent for splitting in block 520. n is a 8K maximum number (8K Bytes being the maximum frame size) represented on 13 bits. The $n_0$ address (one byte) is sent for searching in $T_0$ table (block 530) and the result of table look up is sent as input to the block Remult operator (535); the $n_1$ address (one byte) is sent for searching in $T_1$ table (block 525) and the result of table look up is sent as input to the block Remult operator (540). The output from 535 Remult operator, the Remult of the two inputs, B(X) and $T_0(n_0)$ is sent as one input to the second Remult operator (block 540). As output from the Remult operator 540, is the dFCS value sent to the block 545 for transfer thru the bi-directional bus 500.

Full software implementation for Frame Relay:

The full software implementation comprises two correlated algorithms for short and long messages. The Remult hardware operator is not used, the two new tables are larger than with the preferred embodiment and the number of necessary computer cycles has also increased. However, the full software implementation of the new FCS calculation based on the differentiation between short and long packets, reaches the objectives of performance and simplification:

n being the message size in bytes, no size for 'short packets' still lower than N $$n = n_0 + N \cdot n_1$$

$$dFCS = Rem_{G(X)}(Rem_{G(X)}(X^{8N \cdot n_1}) \cdot Rem_{G(X)}(X^{8n_0} \cdot B(X)))\quad\text{(expression 5)}$$

The expression $Rem_{G(X)}(X^{8N \cdot n_1})$ can be precomputed in a table, $T_1$, of 8192/N inputs, as a function of $n_1$ (same table as in the implementations with hardware):

$$T_1(n_1) 32\ Rem_{G(X)}(X^{8N \cdot n_1})$$

Let's compute the following part of expression 5 which is also the expression of dFCS for short packets ($n_1 = 0$):

$$Rem_{G(X)}(X^{8n_0} \cdot B(X))$$

In the case of Frame Relay, B(X) is a degree 16 polynomial representing a 16 bits field (two bytes). If we split the two bytes into the Most Significant Bits (MSBs) $B_1(x)$ and Least Significant Bits (LSBs) $B_2(x)$, then polynomial B(x) can be written:

$$B(X) = X^8 B_1(X) + B_2(X)$$

$$Rem_{G(X)}(X^{8n_0} \cdot B(X)) = Rem_{G(X)}(X^{8(n_0+1)} \cdot B_1(X) + X^{8n_0} \cdot B_2(X))$$

$$Rem_{G(X)}(X^{8n_0} \cdot B(X)) = Rem_{G(X)}(X^{8(n_0+1)} \cdot B_1(X)) + Rem_{G(X)}(X^{8n_0} \cdot B_2(X))\quad\text{(expression 7)}$$

The expressions:

$$Rem_{G(X)}(X^{8(n_0+1)} \cdot B_1(X))$$

and $$Rem_{G(X)}(X^{8n_0} \cdot B_2(X))$$

can be precomputed in a table, T' of $(n_0+1) \times 2^8$ inputs where the values are represented as a function of $n_0$ (integer) and the 8th order polynomials $B_i(X)$ with the coefficients belonging to the modulo 2 Galois's field (all the possible 8 bits values).

$$T'(n_0, B_i(X)) = Rem_{G(X)}(Xn_0 \cdot B_i(X))$$

The size in bytes of the table T' (1 entry being a double byte) is:

$(n_0+1) \times 2^8 \times 2$ (expression 8)

Expression 7 is calculated with T':

$$Rem_{G(X)}(X^{8 \cdot n_0} \cdot B(X)) = T'(n_0+1, B_1) + T'(n_0, B_2)$$

expressing also the dFCS calculation for short packets. One can easily calculate that the expression 7 computation algorithm including two table look ups: one for $B_1$ and a second for $B_2$, takes 12 computer cycles.

For long packets calculation, coming back to expression 5 calculation algorithm:

$$dFCS = Rem_{G(X)}(Rem_{G(X)}(X^{8 \cdot N \cdot n_1}) \cdot Rem_{G(X)}(X^{8 \cdot n_0} \cdot B(X)))$$

(expression 5)

Expression 5 is calculated using T' and $T_1$:

$$dFCS = Rem_{G(X)}(T_1(n_1) \cdot (T(n_0, B_1) + T(n_0, B_2)))$$

Figure 7:
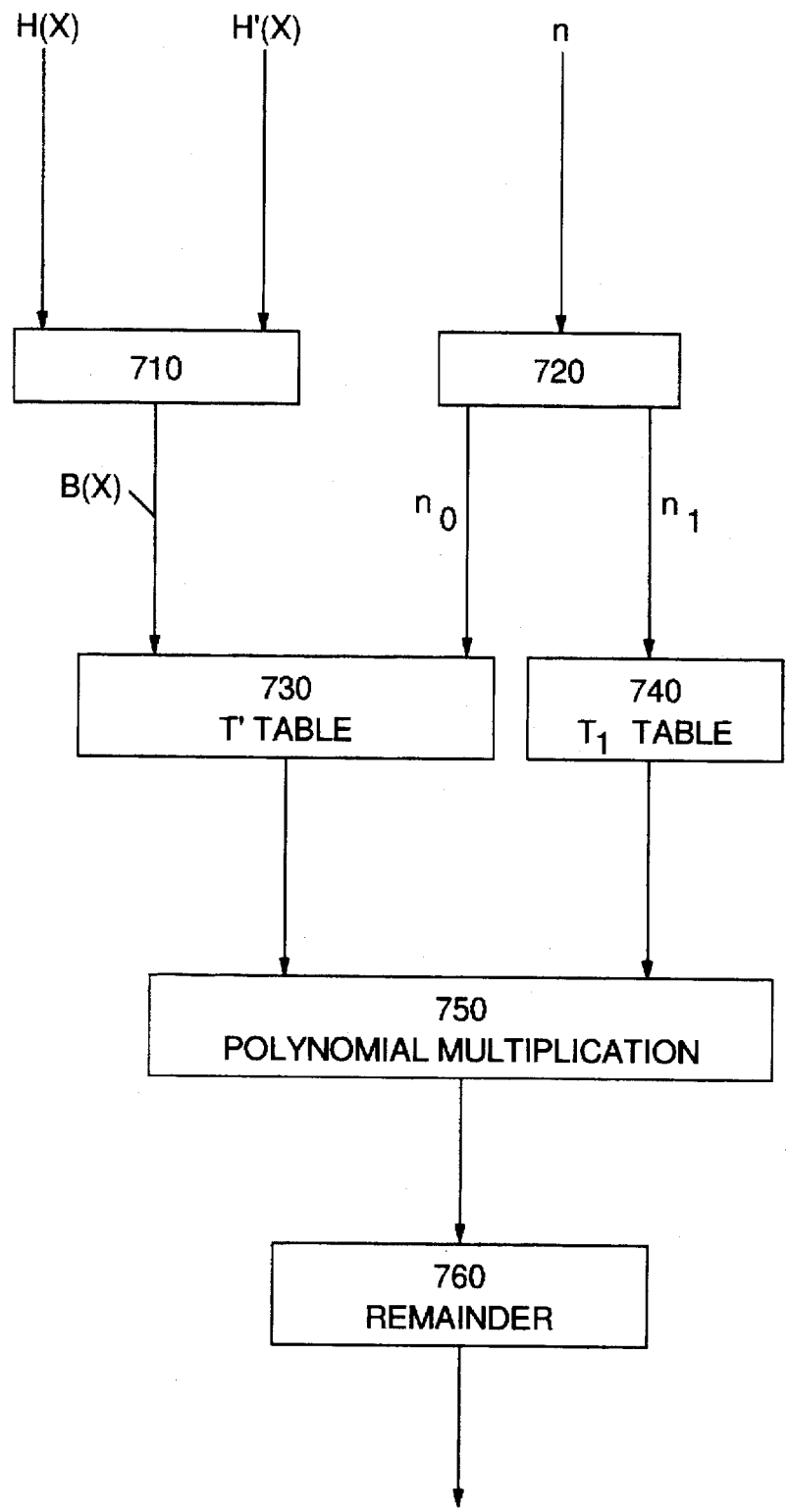
FIG. 7 is a block diagram of the full software implementation

One can evaluate this calculation takes 150 computer cycles when following the block diagram of FIG. 7:

710 is for B(X) calculation from the original and modified fields respectively represented by polynomials H(X) and H'(X).

720 represents computation of $n_0$ and $n_1$ from n, taking into account the maximum size one has decided for short packets

730 represents the two T' table look ups and the addition of the result to obtain $$Rem_{G(X)}(X^{8 \cdot n_0} \cdot B(X)) = T'(n_0, B_1) + T'(n_0, B_2)$$

740 step is for T1 table look up, $n_1$ being the input variable.

$$T_1(n_1) = Rem_{G(X)}(X^{8 \cdot N \cdot n_1})$$

750 is for modulo 2 polynomial multiplication without carry.

$$T_1(n_1) \cdot (T'(n_0, B_1) + T'(n_0, B_2))$$

760 is to compute the remainder of modulo 2 polynomial division of the polynomial resulting of the previous step by the generator polynomial G(X).

$$dFCS = Rem_{G(X)}(T_1(n_1) \cdot (T'(n_0, B_1) + T'(n_0, B_2)))$$

The following table provides the computing resources necessary to compute dFCS with the best existing solution identified (first row), the full software implementation of the invention (second row) and the solution of preferred embodiment of the invention (third row); the assumptions on network messages characteristics being these of Frame Relay.

| Solution | Table size | Cycles | Notes |
|---|---|---|---|
| Prior art solution software | 32 bytes | 900 | 13 iterations |
| Prior art solution (EP-313707) hardware | 32 bytes | 13 | 13 iterations, Remult operator |
| New software | 16K bytes | 12 (short packets), 150 (long packets) | 2 iterations |
| New best | 576 bytes | 3 (short packets), 5 (long packets) | Only Remult hardware implemented |

Compared to the existing solution, the computing resources in terms of memory are comparable and in terms of computer cycles are significantly improved for dFCS calculation with the best solution of the invention. As the dFCS calculation is the central point for calculation of modified CRC encoded messages, the solution of the invention allows corresponding substantial improvement for this calculation in intermediate network nodes.

We claim:

1. For use at an intermediate node of a telecommunications data network at which input messages are received and may be modified before being forwarded as output messages to other nodes in the network, each message being contained in a frame having a header field, a data field and a CRC code field, a method of calculating a new CRC code for use in an output message, the value of said new CRC code being a function of the CRC code in the input message, modifications made in a modifiable part of the header field at the intermediate node, and the length of the data field, the distance in bits between the end of the modifiable part and the end of the message being defined as a variable m, said method comprising the steps of:

a. calculating the bit by bit difference of the input message and the message once modified in the intermediate network node, said difference being represented by a polynomial B(X), X being the symbolic variable of the polynomial representation and the polynomial coefficients belonging to the modulo 2 Galois's Field.

b. solving the equation $m+16=n_0+N \cdot n$ derive integer values for $n_0$ and $n_1$ where N is an integer power of the base 2;

c. calculating the difference between the CRC codes of the input and the modified messages using the three values $n_0$, $n_1$ and m as input; and d. performing a modulo 2 addition of the said difference with the initial message code value to obtain the new message code value.

2. The method according to claim 1, where the step of calculating the difference between the CRC codes comprises the following intermediate steps:

a. performing a look up operation to a first table $T_0$, addressed by $n_0$ and providing the remainder of the polynomial division of $X^{8 n_0}$ by the polynomial generator G(X) of the CRC code, the coefficients of said polynomial belonging to modulo 2 Galois's Field;

b. performing a modulo 2 polynomial multiplication of B(X) by the result of the preceding step;

c. computing the remainder of the division by G(X) of the 15 high order bits of the result of the preceding step obtained by modulo 2 polynomial multiplication of said result by $X^{16}$;

d. if m+16 is low than N, adding the previous result to the 16 low order bits of step b) herein the result being the difference between the input and modified message code values.

e. if m+16 is greater than N:
  1) performing a look up operation to a second table $T_1$, addressed by $n_1$ and providing the remainder of the modulo 2 polynomial division by G(X) of $X^{8Nn}1$;
  2) performing a modulo 2 polynomial multiplication of B(X) and the result of preceding step;
  3) computing the remainder of the division by G(X) of the 15 high order bits of the result of the preceding step obtained by modulo 2 polynomial multiplication of said result by $X^{16}$;
  4) adding the previous result to the 16 low order bits of step e.1) the result of this current step being the difference between the input and the modified message code values.

3. The method, according to claim 1 where the step of calculating the difference between the CRC codes comprises the following steps:
  a. performing a look up operation in a third table T', addressed by $B_i(X)$ and $n_0$ and providing the remainder of the polynomial division by G(X) of $X^{8n}0 \cdot B_i(X)$ where B(X) is the polynomial representation of all the possible 8 bits values;
  b. adding two third table values, the first being addressed by $n_0$ and the 8 high order bits values of B(X), and the second by $n_0+1$ and the 8 low order bits values of B(X);
  c. if m+16 is lower than N, selecting the result of preceding step as the difference between the input and the modified message code values;
  d. if m+16 is greater than N, performing a look up operation in the second table $T_1$, with the value $n_1$;
  e. performing modulo 2 polynomial multiplication of the results of steps b and d herein;
  f. calculating the remainder of the polynomial division of the result of step e herein by G(X), the result being the difference between the input and the modified message.

4. The method, according to claim 1, 2 or 3, where the telecommunication network is a Frame Relay network, the messages being variable length packets, the error detection and correction code being the 16 bits Frame Check Sequence (FCS) based on the generator polynomial G(X) from the V41 CCITT recommendation, the m+16 value being the message size in bytes, N being the maximum size in bytes of the short messages, the modification brought to the packets in the intermediate network node applying to the two first bytes of the packet.

5. In an intermediate node of a telecommunication network, an apparatus to calculate the new CRC code of input data bits messages which have been modified; said CRC code being a function of the modified message field, the initial error code of the message and the distance m between the end of the modified message field and the end of the message, said apparatus comprising;
  a. means for calculating the bit by bit difference of the input message and the message once modified in the intermediate node, said difference being represented by a polynomial B(X), X being the symbolic variable of the polynomial representation and with the coefficients belonging to the modulo 2 Galois's Field (302 or 710);
  b. means for solving the equation $m+16=n_0 30 \, N \cdot n$, to establish integer values for $n_0$ and $n_1$ where N is an integer power of the base 2;
  c. means for calculating the difference between the CRC codes of the input and modified messages using the three values $n_0$, $n_1$ and m as inputs;
  d. means for performing a modulo 2 addition of the said difference with the initial message code value (308) to obtain the new message code value.

6. The apparatus according to claim 5, where the means for calculating the difference between the CRC codes comprise the following intermediate means:
  a. means for performing a look up operation to a first table $T_0$, (525) addressed by $n_0$ and $B_i(X)$ and providing the remainder of the polynomial division of $X^{8n}0$ by the polynomial generator G(X) of the CRC code, the coefficients of said polynomial belonging to modulo 2 Galois's Field;
  b. means for performing a modulo 2 polynomial multiplication of B(X) by said remainder (403);
  c. means for computing (407) the remainder of the division by G(X) of the 15 high order bits of the result of said modulo 2 polynomial multiplication of said result by $X^{16}$;
  d. means, operative if m+16 is lower than N for selecting the remainder computed by the last named means as the difference between the input and modified message code values;
  e. means, operative if m+16 is greater than N, for performing a look up operation to a second table $T_1$, (530) addressed by $n_1$ and providing the remainder of the modulo 2 polynomial division by G(X) of $X^{8N.n}1$ and for performing a modulo 2 polynomial multiplication of B(X) and said remainder and for computing (407) the remainder of the division by G(X) of the 15 high order bits of the result of said modulo 2 polynomial multiplication of said result by $X^{16}$ and for adding the previous result to the 16 low order bits of of the remainder resulting from the look up operation to the second table T1, the result being the difference between the input and the modified message code values.

7. The apparatus, according to claim 5 where the means for computing the remainder further comprises;
  a. means for performing a look up operation in a third table, T',(730) addressed by $n_0$ and $B_i(X)$ and providing the remainder of the polynomial division by G(X) of $X^{8n}0 \cdot Bi(X)$
  where $B_i(X)$ is the polynomial representation of all the possible 8 bits values;
  b. means for adding two third table values, the first being addressed by $n_0$ and the 8 high order bits values of B(X), and the second by $n_0+1$ and the 8 low order bits values of B(X)(730);
  c. means operative if m+16 is lower than N, for selecting the result provided by the last-named means as the difference between the input and the modified message code values;
  d. means operative if m+16 is greater than N for performing a look up operation in the second table $T_1$, (740) with the value $n_1$ and for performing the modulo 2 polynomial multiplication (750) of the results provided by said adding means the said means for performing a look up operation in the second table T1 and for calculating the remainder of the polynomial division by G(X) (760), the result being the difference between the input and the modified message.

8. The apparatus according to claim 5, 6 or 7, where the telecommunication network is a Frame Relay network, the messages being variable length packets, the error detection and correction code being the 16 bits Frame Check Sequence (FCS) based on the generator polynomial G(X) from the V41 CCITT recommendation, the m+16 value being the message size in bytes, N being the size in bytes of the short messages, the modification brought to the packets in the intermediate network node applying to the two first bytes of the packet.

9. The apparatus, according to claim 5, 6 or 7, where the telecommunication network is a Frame Relay network, the messages being variable length packets, the error detection and correction code being FCS, m+16 value being the message size in bytes, N being the size in bytes of the short messages, the modification brought to the packets in the intermediate node applying to the two first bytes of the packet.

* * * * *